United States Patent
Sato et al.

(10) Patent No.: US 11,329,002 B2
(45) Date of Patent: May 10, 2022

(54) SEMICONDUCTOR DEVICE AND FABRICATION METHOD FOR SEMICONDUCTOR DEVICE

(71) Applicant: SONY SEMICONDUCTOR SOLUTIONS CORPORATION, Kanagawa (JP)

(72) Inventors: Teruyuki Sato, Kumamoto (JP); Shinichi Arakawa, Kumamoto (JP); Takayuki Enomoto, Kumamoto (JP); Yohei Chiba, Kumamoto (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 65 days.

(21) Appl. No.: 16/638,499

(22) PCT Filed: Jul. 24, 2018

(86) PCT No.: PCT/JP2018/027747
§ 371 (c)(1),
(2) Date: Feb. 12, 2020

(87) PCT Pub. No.: WO2019/039173
PCT Pub. Date: Feb. 28, 2019

(65) Prior Publication Data
US 2020/0303317 A1    Sep. 24, 2020

(30) Foreign Application Priority Data
Aug. 21, 2017 (JP) .............................. JP2017-158724

(51) Int. Cl.
*H01L 23/544* (2006.01)
*H01L 27/146* (2006.01)
(Continued)

(52) U.S. Cl.
CPC ........ *H01L 23/544* (2013.01); *H01L 27/1461* (2013.01); *H01L 21/027* (2013.01); *H01L 21/266* (2013.01); *H01L 2223/54426* (2013.01)

(58) Field of Classification Search
CPC ............. H01L 27/14687; H01L 23/544; H01L 27/1461; H01L 2223/54426; H01L 2223/5442; G03F 7/20; G03F 9/00
See application file for complete search history.

(56) References Cited

U.S. PATENT DOCUMENTS 6,358,814 B1 * 3/2002 Harada ................. H01L 23/544
257/E23.179
2001/0032987 A1 * 10/2001 Narui ................ H01L 27/14806
257/225

(Continued)

FOREIGN PATENT DOCUMENTS

EP    0961320 A2    12/1999
JP    02-001901 A    1/1990
(Continued)

OTHER PUBLICATIONS

International Search Report and Written Opinion of PCT Application No. PCT/JP2018/027747, dated Sep. 4, 2018, 11 pages of ISRWO.

*Primary Examiner* — Bilkis Jahan
*Assistant Examiner* — Victor V Barzykin
(74) *Attorney, Agent, or Firm* — Chip Law Group

(57) ABSTRACT

Fabrication of an alignment mark in a semiconductor device is simplified. A semiconductor device including a semiconductor substrate, an epitaxial layer, and an alignment mark is provided. The epitaxial layer included in the semiconductor device includes a single-crystalline semiconductor that is epitaxially grown on a surface of the semiconductor substrate included in the semiconductor device. The alignment (Continued)

mark included in the semiconductor device is disposed between the semiconductor substrate and the epitaxial layer.

10 Claims, 10 Drawing Sheets

(51) Int. Cl.
  *H01L 21/027* (2006.01)
  *H01L 21/266* (2006.01)

(56) References Cited

U.S. PATENT DOCUMENTS

| | | | | |
|---|---|---|---|---|
| 2001/0054723 | A1* | 12/2001 | Narui | H01L 27/14683 |
| | | | | 257/228 |
| 2004/0007722 | A1* | 1/2004 | Narui | H01L 27/14687 |
| | | | | 257/228 |
| 2008/0150067 | A1* | 6/2008 | Park | H01L 27/14609 |
| | | | | 257/440 |
| 2010/0007035 | A1* | 1/2010 | Shimada | H01L 23/544 |
| | | | | 257/792 |
| 2015/0303119 | A1* | 10/2015 | Tamaso | H01L 29/66068 |
| | | | | 438/14 |
| 2017/0170288 | A1* | 6/2017 | Kiyosawa | H01L 29/66068 |
| 2017/0186695 | A1* | 6/2017 | Moser | H01L 21/308 |
| 2017/0358539 | A1* | 12/2017 | Tsunemine | H01L 21/0273 |
| 2019/0348318 | A1* | 11/2019 | Sakata | H01L 29/7802 |

FOREIGN PATENT DOCUMENTS

| | | |
|---|---|---|
| JP | 03-040415 A | 2/1991 |
| JP | 11-329923 A | 11/1999 |
| JP | 2002-033458 A | 1/2002 |
| JP | 2007-280978 A | 10/2007 |
| JP | 2010-021293 A | 1/2010 |
| JP | 2010-135533 A | 6/2010 |
| JP | 2011-165987 A | 8/2011 |
| JP | 2012-009576 A | 1/2012 |
| KR | 100610717 B1 | 8/2006 |
| TW | 432708 B | 5/2001 |

* cited by examiner

SEMICONDUCTOR DEVICE AND FABRICATION METHOD FOR SEMICONDUCTOR DEVICE

CROSS REFERENCE TO RELATED APPLICATIONS

This application is a U.S. National Phase of International Patent Application No. PCT/JP2018/027747 filed on Jul. 24, 2018, which claims priority benefit of Japanese Patent Application No. JP 2017-158724 filed in the Japan Patent Office on Aug. 21, 2017. Each of the above-referenced applications is hereby incorporated herein by reference in its entirety.

TECHNICAL FIELD

The present technique relates to a semiconductor device and a fabrication method for the semiconductor device. The present technique relates, more particularly, to a semiconductor device including an alignment mark and a fabrication method for the semiconductor device.

BACKGROUND ART

Conventionally been used is a semiconductor device that is configured on an epitaxial wafer on which an alignment mark is disposed. For example, used is a semiconductor device for which the semiconductor main body portion is fabricated by forming on a silicon substrate an oxide film pattern that functions as an alignment mark, and thereafter forming an epitaxial layer by causing epitaxial growth to take place. For this semiconductor device, in fabrication steps executed thereafter, positioning of a photomask is executed using the alignment mark on the silicon substrate and a resist pattern for forming an isolation region or the like is thereby produced.

When the above epitaxial growth takes place, in a case where the foundation is a single-crystalline silicon, the epitaxial layer also grows as a single crystal of silicon. On the other hand, a polysilicon layer consequently grows in a region whose foundation is the above-described oxide film (the alignment mark). Used is a semiconductor device for which this polysilicon layer is removed by etching to expose the oxide film to be used as an alignment mark (an alignment mark) (see, e.g., PTL 1).

CITATION LIST

Patent Literature

[PTL 1]
Japanese Patent Laid-Open No. Hei 3-40415

SUMMARY

Technical Problem

With the above conventional technique, because the polysilicon layer stacked on the alignment mark is removed, a problem arises that the fabrication steps for the semiconductor device become complicated.

The present technique has been conceived in view of the above-described problem and an object thereof is to simplify the fabrication of the alignment mark for a semiconductor device that includes an epitaxial layer.

Solution to Problem

The present technique has been conceived to solve the above-described problem, and a first aspect thereof is a semiconductor device that includes a semiconductor substrate, an epitaxial layer that includes a single-crystalline semiconductor that is epitaxially grown on a surface of the semiconductor substrate, and an alignment mark that is disposed between the semiconductor substrate and the epitaxial layer. An action is thereby provided that the epitaxial layer of the single-crystalline semiconductor is disposed on a side of a surface of the alignment mark. Recognition of the alignment mark through the epitaxial layer is assumed. Regarding this, "a side of a surface of the alignment mark" is the side on which, when the alignment mark is used for alignment, recognition of the alignment mark such as visual recognition is executed, and is the side on which photolithography and the like in the succeeding fabrication steps of the semiconductor device are executed.

Moreover, in this first aspect, the epitaxial layer may obstruct the surface of the alignment mark disposed on the semiconductor substrate when the epitaxial growth takes place. An action is thereby provided that the surface of the alignment mark is covered with the epitaxial layer.

Moreover, in this first aspect, the alignment mark may be disposed in a recess portion formed in the semiconductor substrate, and the epitaxial layer may obstruct the surface of the alignment mark by causing epitaxial growth to take place on a side wall of the recess portion. An action is thereby provided that the epitaxial layer using the side wall as its starting point epitaxially grows toward the vicinity of the upper face of the alignment mark and obstructs the surface of the alignment mark.

Moreover, in this first aspect, the epitaxial layer may obstruct the surface of the alignment mark by single-crystallizing the polycrystalline semiconductor formed on the surface of the alignment mark disposed on the semiconductor substrate when the epitaxial growth takes place. An action is thereby provided that the polycrystalline semiconductor concurrently formed with the epitaxial layer is single-crystallized and the single-crystalline semiconductor is disposed on the side of the surface of the alignment mark.

Moreover, in this first aspect, as to the epitaxial layer, the polycrystalline semiconductor formed on the surface of the alignment mark may be single-crystallized using an annealing process. An action is thereby provided that the single-crystalline semiconductor for which the annealing process is executed is disposed on the side of the surface of the alignment mark.

Moreover, in this first aspect, the alignment mark may be disposed along the side wall of the recess portion formed in the semiconductor substrate and the epitaxial layer may obstruct the surface of the alignment mark by causing epitaxially growth to take place on a bottom face of the recess portion. An action is thereby provided that the epitaxial layer using the bottom face of the recess portion as its starting point epitaxially grows along the alignment mark and obstructs the surface of the alignment mark.

Moreover, in this first aspect, the epitaxial layer may obstruct the surface of the alignment mark by growing along the surface of the alignment mark disposed on the semiconductor substrate. An action is thereby provided that the epitaxial layer using the semiconductor substrate on the periphery of the alignment mark as its starting point epitaxially grows along the alignment mark and obstructs the surface of the alignment mark.

Moreover, in this first aspect, the alignment mark may include an oxide film. An action is thereby provided that the alignment mark including an oxide film is disposed between the semiconductor substrate and the epitaxial layer.

Moreover, in this first aspect, the alignment mark may include a metal film. An action is thereby provided that the alignment mark including a metal film is disposed between the semiconductor substrate and the epitaxial layer.

Moreover, in this first aspect, the alignment mark may include a cavity. An action is thereby provided that the alignment mark including a cavity is disposed between the semiconductor substrate and the epitaxial layer.

Moreover, a second aspect of the present technique is a semiconductor device that includes a semiconductor substrate, plural epitaxial layers each including a single-crystalline semiconductor that is stacked on each other on a surface of the semiconductor substrate, by a plurality of times of epitaxial growth, and plural alignment marks disposed between the semiconductor substrate and the epitaxial layer and between the epitaxial layers adjacent to each other. An action is thereby provided that the plural alignment marks are stacked on each other through the epitaxial layers. Recognition of the alignment marks through the epitaxial layers is assumed.

Moreover, a third aspect of the present technique is a fabrication method for a semiconductor device, including an alignment mark formation step of forming an alignment mark on the surface of a semiconductor substrate, and an epitaxial layer formation step of forming an epitaxial layer by epitaxial growth, on the surface of the semiconductor substrate and the surface of the alignment mark. An action is thereby provided that the epitaxial layer of a single-crystalline semiconductor is disposed on the side of the surface of the alignment mark. Recognition of the alignment marks through the epitaxial layers is assumed.

Advantageous Effect of Invention

According to the present technique, an excellent effect is achieved that a fabrication method is simplified for an alignment mark in a semiconductor device that includes an epitaxial layer.

DESCRIPTION OF EMBODIMENTS

Figure 1:
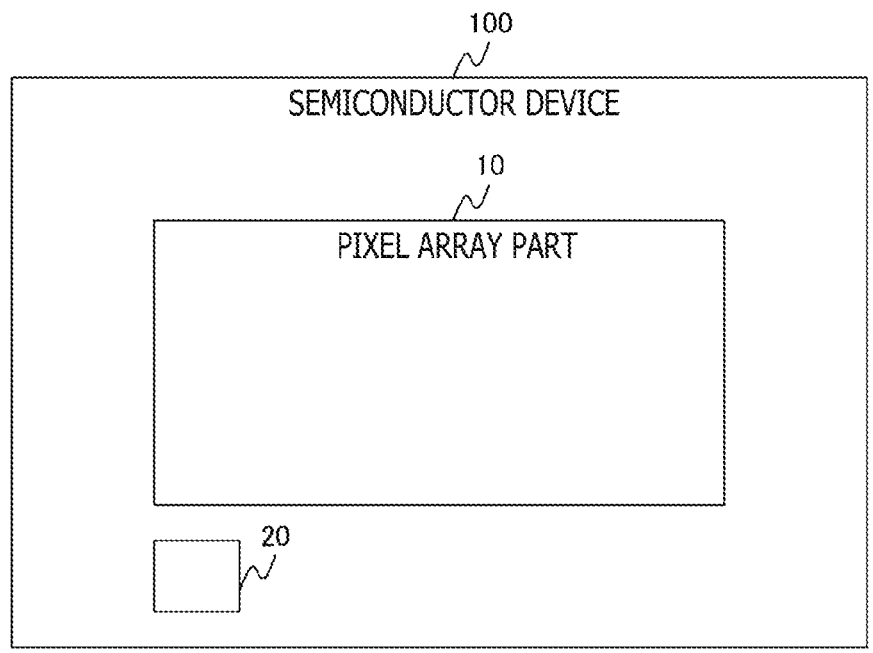
FIG. 1 is a diagram depicting a configuration example of a semiconductor device according to an embodiment of the present technique.

Forms to implement the present technique (hereinafter, each referred to as an "embodiment") will next be described with reference to the drawings. In the drawings below, the same or similar parts are given the same or similar reference signs. The drawings however are schematic, and the ratios and the like of the dimensions of each part do not necessarily match with those in reality. Moreover, needless to say, parts each having the relations and ratios of the dimensions different among the drawings are included in the drawings. Moreover, the description for the embodiments will be made in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment 1. First Embodiment

[Configuration of Semiconductor Device]

FIG. 1 is a diagram depicting a configuration example of a semiconductor device according to an embodiment of the present technique. This drawing depicts the configuration of an imaging element that is used in a camera or the like, and that produces and outputs an image signal that constitutes an image of an object. A semiconductor device to which the present technique is applied will be described taking this imaging element as an example. The semiconductor device 100 in this drawing is formed on a semiconductor chip and includes a pixel array part 10. Moreover, the semiconductor chip having the semiconductor device 100 formed thereon further includes an alignment mark 20.

The pixel array part 10 is a pixel array part that has pixels (not depicted) each producing an image signal according to the light applied thereto, disposed in a two-dimensional grid. A plurality of the image signals corresponding to that for one screen is produced by these pixels. The image signals according to the object can be produced and acquired, by condensing the light from the object onto the pixel array part 10 using a lens and the like not depicted. The pixels each have a photoelectric conversion part that produces a charge according to the applied light and a pixel circuit that produces the image signal based on the charge produced by the photoelectric conversion part, disposed therein. In addition, a photodiode is usable as the photoelectric conversion part.

The alignment mark 20 is a mark used to execute alignment of a photomask that is used when the semiconductor device 100 is formed. When the semiconductor device 100 is formed on the semiconductor chip, semiconductor elements and the like included in the above-described pixels are formed using photolithography. In this photolithography, a resist is applied to the semiconductor chip and a resist pattern is formed by executing exposure and development for the applied resist. Etching and the like are next executed on the basis of the formed resist pattern. After this etching, the remaining resist is removed. These steps are repeatedly executed and the semiconductor device 100 is thereby formed. The photomask is used as a mask used when the applied resist is exposed, and exposure is executed using a photomask that is different for each of the photolithography steps. At the plurality of exposure steps, in order to cause the positions of the photomasks to fit with each other, the alignment mark 20 is used. More specifically, positioning of each of the photomasks on the semiconductor chip can be executed by causing the alignment mark 20 viewed from the upper face of the semiconductor chip and the alignment mark disposed on the photomask to match with each other. Prevention of gaps among the resist patterns in the plurality of photolithography steps is enabled. The details of the configuration of the semiconductor device 100 will be described later.

[Configuration of Alignment Mark]

Figure 2:
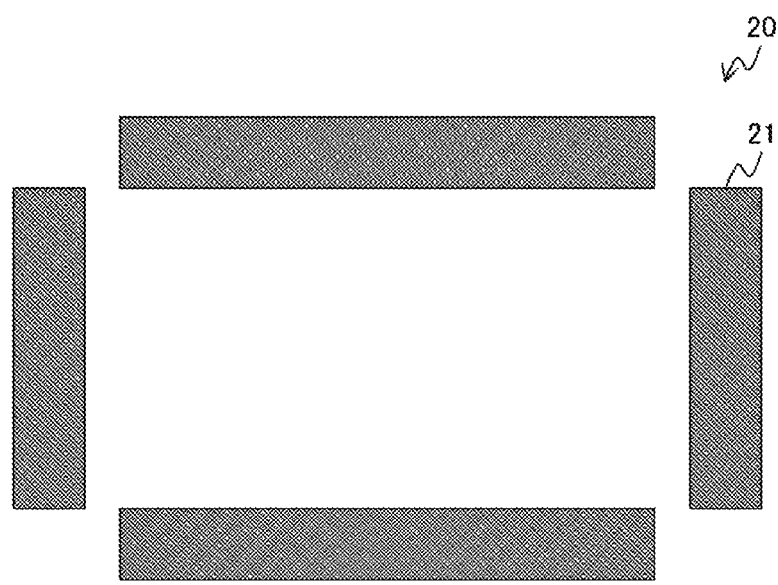
FIG. 2 is a diagram depicting a configuration example of an alignment mark according to a first embodiment of the present technique.

FIG. 2 is a diagram depicting a configuration example of an alignment mark according to the first embodiment of the present technique. This drawing is a front diagram depicting the configuration of the alignment mark 20. The alignment mark 20 in this drawing includes four rectangle-shaped films 21. As described later, the films 21 are disposed on the semiconductor substrate included in the semiconductor chip. Moreover, the films 21 can, for example, each include an oxide such as a silicon oxide ($SiO_2$). For the exposure, alignment can be executed checking the four films 21 from the above of the semiconductor chip. Regarding this, the alignment mark 20 is not limited to this example. For example, cruciform films are also usable as the alignment mark 20. Moreover, films each including a metal such as aluminum (Al) and copper (Cu) are also usable as the films 21.

[Configuration of Semiconductor Chip]

Figure 3:
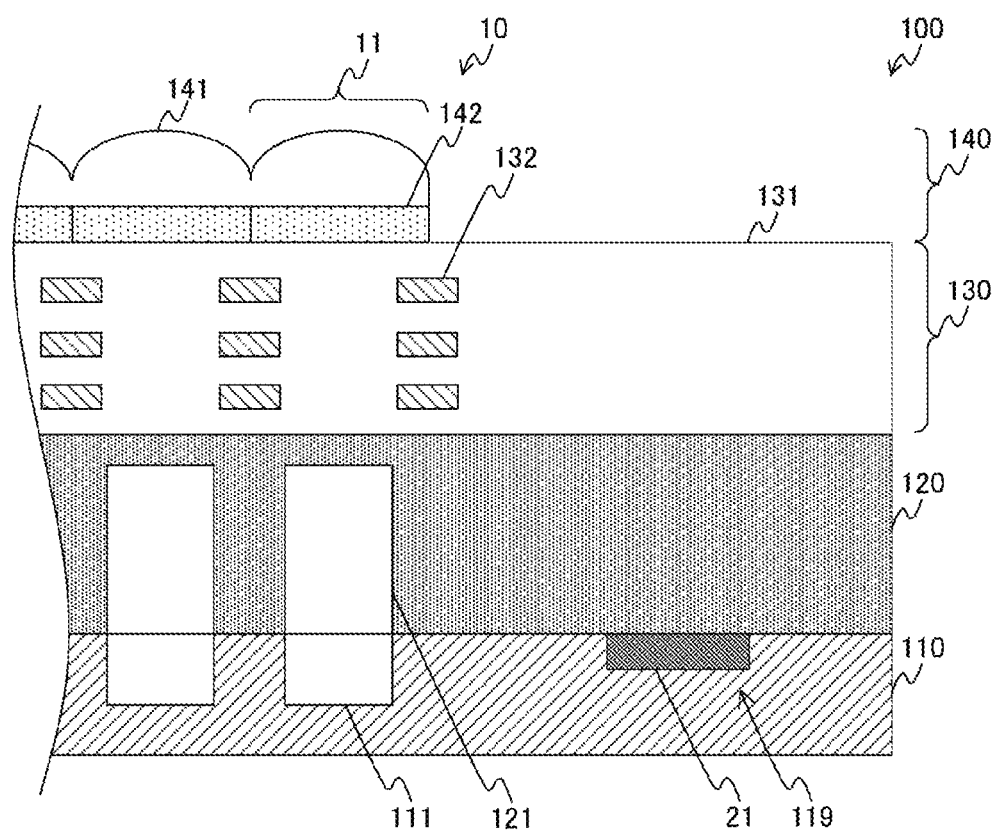
FIG. 3 is a cross-sectional diagram depicting a configuration example of a semiconductor device according to the first embodiment of the present technique.

FIG. 3 is a cross-sectional diagram depicting a configuration example of a semiconductor device according to the first embodiment of the present technique. This drawing is a cross-sectional diagram of the semiconductor chip on which the semiconductor device 100 is configured. The semiconductor device 100 in this drawing includes a semiconductor substrate 110, an epitaxial layer 120, a wiring region 130, and an incident light transmitting part 140. In this regard, the semiconductor substrate 110 and the epitaxial layer 120 constitute a semiconductor region.

The semiconductor region is a region in which the semiconductor portion of each of electronic parts included in the semiconductor device 100 such as pixels (pixels 11 in this drawing) is formed. MOS transistors used in the photodiodes and the pixel circuits in the above-described pixels correspond to these electronic parts. This drawing depicts the photodiodes among the electronic parts. The semiconductor portion of each of the electronic parts in the semiconductor region is formed in a well region formed to have a predetermined conductivity type, for example, a P type.

For convenience, the semiconductor substrate 110 and the epitaxial layer 120 in this drawing are assumed to be the well region. In the inside of this well region, N-type semiconductor regions 111 and 121 having a conductivity type different from that of the well region are formed. The N-type semiconductor regions 111 and 121 correspond to the photodiode, and photoelectric conversion is executed in a PN-junction portion that is formed at the interface between the N-type semiconductor regions 111 and 121 and the P-type well region formed on the periphery thereof. The charge produced by the photoelectric conversion is accumulated in the N-type semiconductor regions 111 and 121, and is converted into an image signal by the pixel circuit after a predetermined period of time for exposure elapses.

For example, a wafer including single-crystalline silicon corresponds to the semiconductor substrate 110 that constitutes the above-described semiconductor region. Moreover, the epitaxial layer 120 is a semiconductor layer of single-crystalline silicon that is formed by epitaxial growth on the surface of the semiconductor substrate 110, and can be formed to have a thickness of 1 to 10 μm, for example. Formation of the semiconductor region including a small number of lattice defects and the like is enabled by the epitaxial growth. The yield of the semiconductor device 100 can therefore be improved by forming the pixel circuit and the like in the epitaxial layer 120. The above-described well region is formed in both the semiconductor substrate 110 and the epitaxial layer 120. Moreover, in this drawing, the N-type semiconductor region 111 is formed in the semiconductor substrate 110 and the N-type semiconductor region 121 is formed in the epitaxial layer 120.

The N-type semiconductor region of the photodiode can be set to be wide (deep) by forming the N-type semiconductor region 111 also in the semiconductor substrate 110 as described above. The efficiency of the photoelectric conversion for the light arriving in the deep portion of the semiconductor such as IR light can thereby be improved and a highly sensitive imaging element can be established. Moreover, the accumulation capacity for the charge produced by the photoelectric conversion can be increased and occurrence of blooming can be prevented, by setting the N-type semiconductor region of the photodiode to be wide. In this regard, the "blooming" is a phenomenon in which the charge produced by the photoelectric conversion overflows from the N-type semiconductor region of the photodiode and flows into a blooming of another pixel, thereby degrading the image quality.

The wiring region 130 is a region in which the electronic parts formed in the semiconductor region are wired to each other. The wiring region 130 includes wiring layers 132 each transmitting an electric signal and the like, and an insulating layer 131 that insulates the wiring layers 132 from each other.

The incident light transmitting part 140 is a part that transmits the light applied to the semiconductor device 100 to the photoelectric conversion part (the photodiode) in the semiconductor region. The incident light transmitting part 140 in this drawing includes an on-chip lens 141 and a color filter 142. The on-chip lens 141 is disposed for each of the pixels 11 and is a lens that condenses the incident light onto the photoelectric conversion part. The color filter 142 is an optical filter and is a filter that transmits therethrough light having a predetermined wavelength, of the light condensed by the on-chip lens 141. Similarly to the on-chip lens 141, the color filter 142 is also disposed for each of the pixels 11.

In addition, this drawing depicts one of the films 21 included in the alignment mark 20 described with reference to FIG. 2. The film 21 is formed between the semiconductor substrate 110 and the epitaxial layer 120. More specifically, the film 21 is disposed by being buried in a recess portion 119 that is formed in the semiconductor substrate 110. The epitaxial layer 120 is a thin film including the single-crystalline silicon, and thus can transmit light therethrough. The alignment mark 20 can therefore be recognized from the side of the epitaxial layer 120 by visual recognition or the like, and can be used as an alignment mark.

Regarding the above, the epitaxial layer 120 is formed by causing epitaxial growth to take place in the region of the single-crystalline silicon on the surface of the semiconductor substrate 110. In contrast, the films 21 each include an oxide or the like and no epitaxial growth consequently occurs on the films 21. However, the epitaxial layer 120 growing on the semiconductor substrate 110 on the periphery of the films 21 continues to grow extending over the upper portion of the films 21, and the upper face of each of the films 21 is thereby consequently obstructed by the epitaxial layer 120. In other words, the epitaxial layer 120 epitaxially grows along the surface of each of the films 21 and is formed to establish a state in which the epitaxial layer 120 covers the films 21. A configuration can thereby be established for the films 21 depicted in this drawing to be disposed between the semiconductor substrate 110 and the epitaxial layer 120.

[Another Configuration of Alignment Mark]

Figure 4:
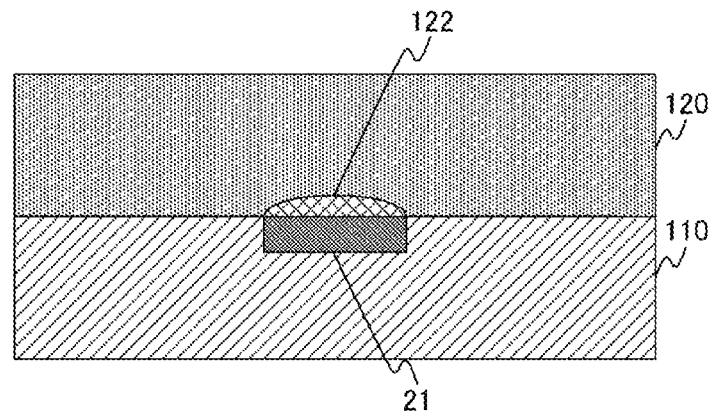
FIG. 4 is a diagram depicting another configuration example of the alignment mark according to the first embodiment of the present technique.

FIG. 4 is a diagram depicting another configuration example of the alignment mark according to the first embodiment of the present technique. Depending on the above-described film formation conditions for the epitaxial layer 120, a polycrystalline semiconductor, for example, polysilicon may deposit on the upper portion of each of the films 21. This drawing depicts an example of this case and depicts an example where a polycrystalline semiconductor layer 122 is formed on the upper portion of each of the films 21. Also in this case, the single-crystalline epitaxial layer 120 is formed on the upper portion of the polycrystalline semiconductor layer 122. This is because the surface of the polycrystalline semiconductor layer 122 is obstructed by the epitaxial layer 120 that grows on the periphery of the films 21 concurrently with the growth of the polycrystalline semiconductor 122 on the upper portion of each of the films 21. Because the polycrystalline semiconductor layer 122 has transmittance of light lower than that of the epitaxial layer 120, when the polycrystalline semiconductor layer 122 is disposed on the upper portion of the alignment mark 20, visibility of the alignment mark 20 is degraded. However, in a case where the film thickness of the polycrystalline semiconductor layer 122 is small, the degradation of the visibility is slight and, even in a case where the polycrystalline semiconductor layer 122 is disposed on the upper portion of the alignment mark 20 (the films 21), alignment using the alignment mark 20 can be executed.

Such obstruction of the upper face of the alignment mark 20 by the epitaxial layer 120 at the time when the epitaxial growth takes place can easily be executed by reducing the width of each of the films 21 used in the alignment mark 20. More specifically, as described with reference to FIG. 2, the films 21 are each formed into the shape of a rectangle (an oblong figure), and the width of the short side thereof is set to be equal to or smaller than a predetermined width, for example, 300 nm or smaller. Easy covering of the upper face of each of the films 21 is thereby enabled when the epitaxial layer 120 adjacent to each of the short sides of the films 21 extends over the upper portion of the films 21 while epitaxially growing. The obstruction of the upper face of each of the films 21 by the epitaxial layer 120 can easily be executed, and the setting of the growth conditions for the epitaxial layer can be simplified.

[Fabrication Method for Semiconductor Device]

Figure 5A:
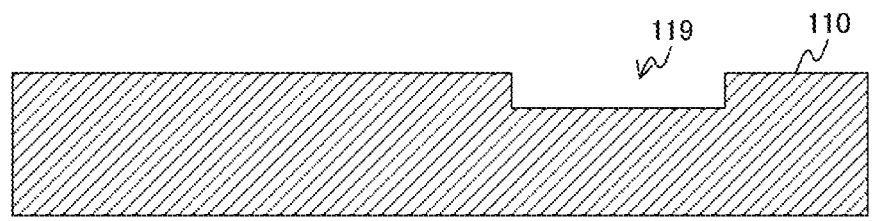
FIGS. 5A, 5B, 5C, 5D, and 5E are diagrams depicting an example of a fabrication method for a semiconductor device according to the first embodiment of the present technique.
Figure 5B:
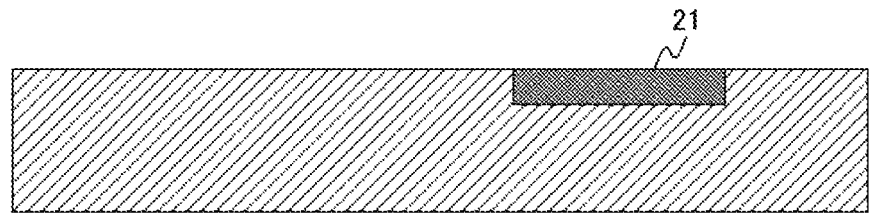

FIGS. 5A, 5B, 5C, 5D, and 5E are diagrams depicting an example of a fabrication method for a semiconductor device according to the first embodiment of the present technique. This drawing is a diagram depicting the fabrication steps for the semiconductor chip. First, the recess portion 119 is formed in a region in which the alignment mark 20 (the films 21) is to be disposed, in the wafer-like semiconductor substrate 110. This can be executed using, for example, dry etching (FIG. 5A). Next, the films 21 are disposed in the recess portion 119. More specifically, an oxide as the material of the films 21 is deposited as a film using CVD (Chemical Vapor Deposition) or the like on the surface of the semiconductor substrate 110 in which the recess portion 119 is formed. The oxide deposited as a film in an area except the recess portion 119 is thereafter removed by etching or CMP (Chemical Mechanical Polishing) and the films 21 can thereby be formed (FIG. 5B). This step is an example of an alignment mark formation step described in the claims.

Figure 5C:
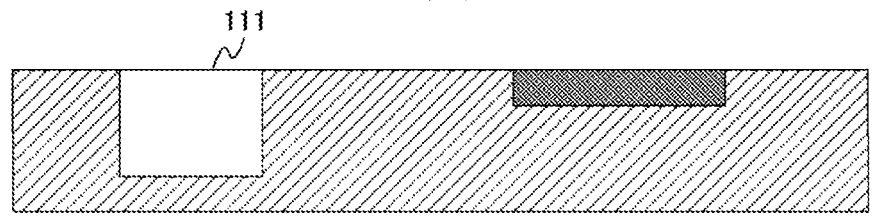

Next, the N-type semiconductor region 111 is formed in the semiconductor substrate 110. This can be executed by, for example, ion implantation. For this ion implantation, a photosensitive resist is applied to the semiconductor substrate 110, and exposure using a mask and development are executed. An opening portion is thereby formed in the photosensitive resist at the formation position of the N-type semiconductor region 111. An impurity ion is thereafter implanted and the N-type semiconductor region 111 can thereby be formed in the semiconductor substrate 110 through the opening portion of the photosensitive resist. When this exposure for the photosensitive resist is executed, the alignment of the mask can be executed using the alignment mark 20 (the films 21) (FIG. 5C).

Figure 5D:
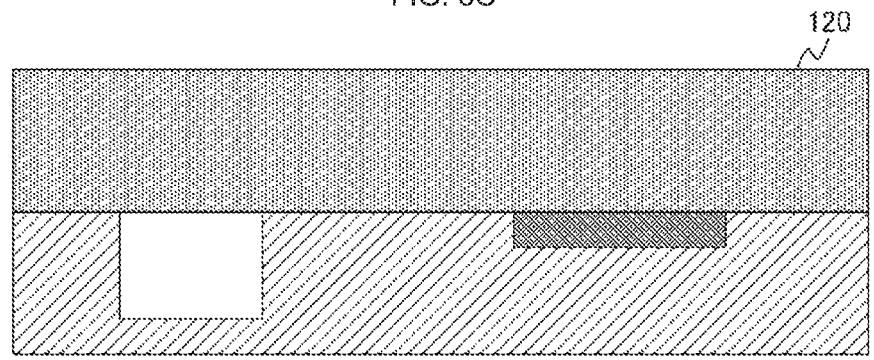

Film formation by epitaxial growth is next executed on the semiconductor substrate 110, and the epitaxial layer 120 is thereby formed. At this time, the surface of the alignment mark 20 (the films 21) is obstructed by the epitaxial layer 120 (FIG. 5D). This step is an example of an epitaxial layer formation step described in the claims.

Figure 5E:
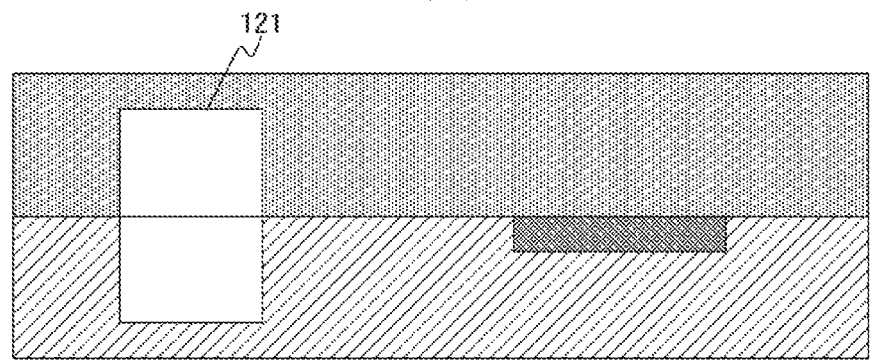

Next, the N-type semiconductor region 121 is formed in the epitaxial layer 120. This can be executed by ion implantation, similarly to the N-type semiconductor region 111 (FIG. 5E). Thereafter, wiring region 130 and the incident light transmitting part 140 are formed, dicing and the like are executed, and the semiconductor chip (the semiconductor device 100) can thereby be fabricated.

In addition, in the process after the formation of the alignment mark 20, when photolithography such as the exposure of the resist is executed, alignment of the mask using the alignment mark 20 can be executed. An alignment error of the mask can be reduced, and the yield of the semiconductor chip can be improved.

Note that the configuration of the semiconductor device 100 described with reference to FIG. 3 is not limited to this example. For example, the semiconductor substrate 110 is polished to reduce its thickness, and it is also possible to fabricate the semiconductor device 100 of a back-illuminated type that has the incident light transmitting part 140 formed on a face of the semiconductor substrate 110 different from the face having the wiring region 130 formed thereon. Moreover, the semiconductor substrate 110 and the epitaxial layer 120 each including a semiconductor other than silicon (such as a compound semiconductor) can also be used.

As described above, as to the semiconductor device 100 of the first embodiment of the present technique, the alignment mark 20 is disposed between the semiconductor substrate 110 and the epitaxial layer 120, and the alignment mark 20 is recognized (visually recognized) through the epitaxial layer 120 of the single-crystalline semiconductor. The fabrication of the alignment mark 20 can thereby be simplified.

Modification Example

The above-described alignment mark 20 includes the films 21 each having the rectangle-shaped cross-section while the films 21 each having a shape different therefrom may be used.

Figure 6A:
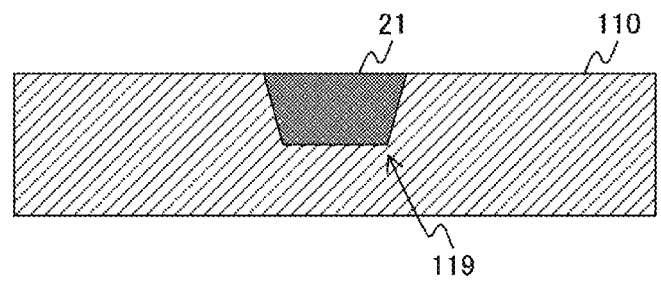
FIGS. 6A, 6B, 6C, and 6D are diagrams depicting a configuration example of an alignment mark according to a modification example of the first embodiment of the present technique.
Figure 6B:
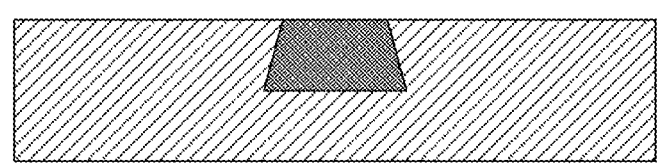
Figure 6C:
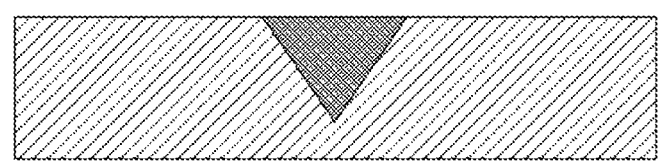
Figure 6D:
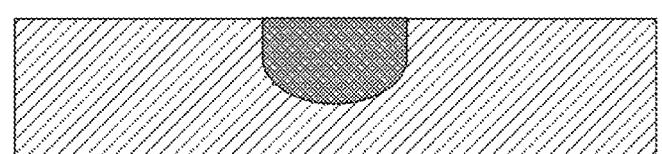

FIGS. 6A, 6B, 6C, and 6D are diagrams depicting configuration examples of an alignment mark according to a modification example of the first embodiment of the present technique. In this drawing, FIGS. 6A and 6B each depict an example acquired in a case where a side face of the film 21 is configured to have a tapered shape. These can be configured by forming the recess portions 119 whose side faces are inclined in a forward tapered shape and a reverse tapered shape in the semiconductor substrate 110. Moreover, the films 21 can each be configured to have a triangular shape (FIG. 6C of this drawing), or a semispherical or a bow-like shape (FIG. 6D of this drawing).

2. Second Embodiment

As to the semiconductor device 100 of the above-described first embodiment, the alignment mark 20 whose surface is flat is used. In contrast, a semiconductor device 100 of the second embodiment of the present technique differs from the first embodiment in that an alignment mark 20 including a recess portion is used.

[Configuration of Alignment Mark]

Figure 7A:
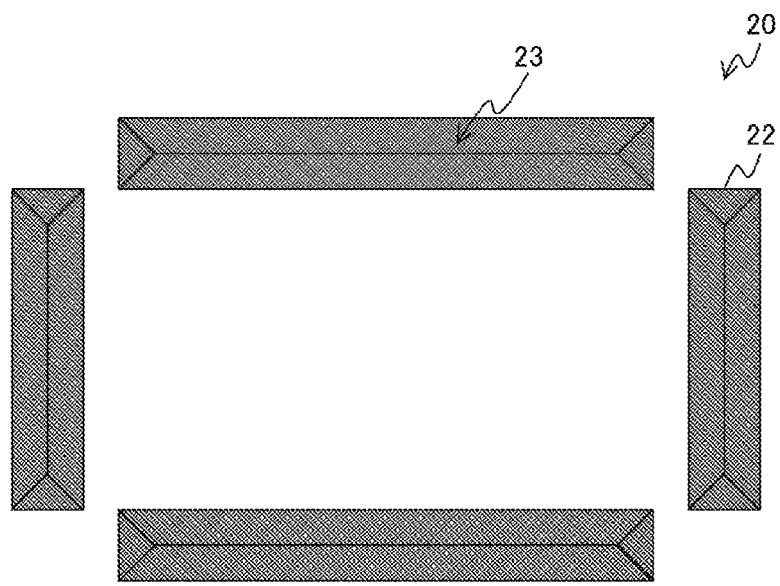
FIGS. 7A, 7B, and 7C are diagrams depicting a configuration example of an alignment mark according to a second embodiment of the present technique.
Figure 7B:
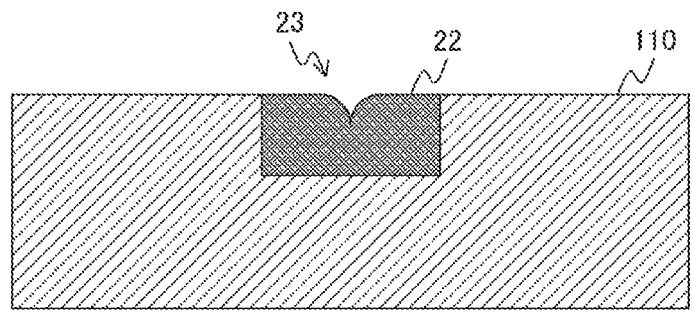
Figure 7C:
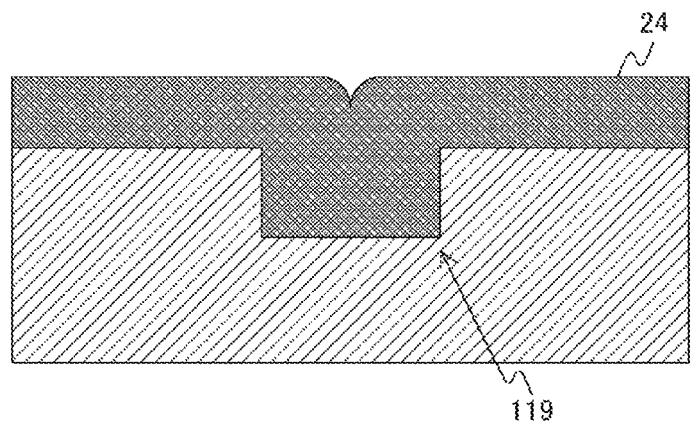

FIGS. 7A, 7B, and 7C are diagrams depicting a configuration example of the alignment mark according to the second embodiment of the present technique. In this drawing, FIG. 7A is a front diagram depicting the configuration of the alignment mark 20. The alignment mark 20 in this drawing includes four films 22. The films 22 each include a recess portion 23 in their central portions. In this drawing, FIG. 7B is a cross-sectional diagram depicting a configuration example of each of the films 22. As depicted in FIG. 7B, the films 22 each include the recess portion 23 in their substantially central portions. In this drawing, FIG. 7C is a diagram depicting an example of the fabrication method for the films 22. As depicted in FIG. 7C of this drawing, when an oxide film 24 as the material of the films 22 is formed as a film on the semiconductor substrate 110, a recess portion is also formed on the surface of the oxide film 24, with the shape of the recess portion being matched with the shape of the recess portion 119 of the semiconductor substrate 110. Thereafter, the films 22 each including the recess portion 23 in their surfaces can be formed by etching the oxide film 24 on the semiconductor substrate 110 except the recess portion 119 by dry-etching of the oxide film 24. The alignment mark 20 in this drawing does not need to have its surface flattened as described above, and the fabrication method can therefore be simplified.

The configuration of the semiconductor device 100 except the above is similar to the configuration of the semiconductor device 100 described in the first embodiment of the present technique and will therefore not be described again.

As described above, as to the semiconductor device 100 of the second embodiment of the present technique, the alignment mark 20 including the films 22 each including the recess portion 23 on their surfaces is used, and the fabrication method for the alignment mark 20 can thereby be further simplified.

3. Third Embodiment

As to the semiconductor device 100 of the above-described first embodiment, the surface of each of the films 21 of the alignment mark 20 is obstructed by the epitaxial layer 120 when the epitaxial growth takes place. In contrast, a semiconductor device 100 of the third embodiment of the present technique differs from the first embodiment in that the polycrystalline semiconductor layer formed on the surface of each of the films 21 when the epitaxial growth takes place is single-crystallized.

[Configuration of Alignment Mark]

Figure 8A:
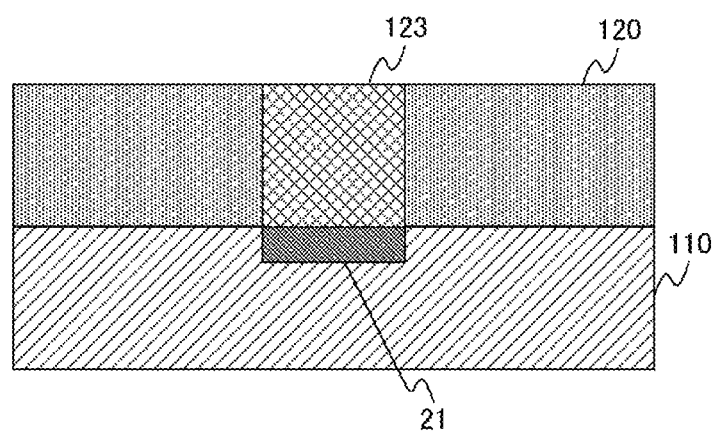
FIGS. 8A and 8B are diagrams depicting a configuration example of an alignment mark according to a third embodiment of the present technique.
Figure 8B:
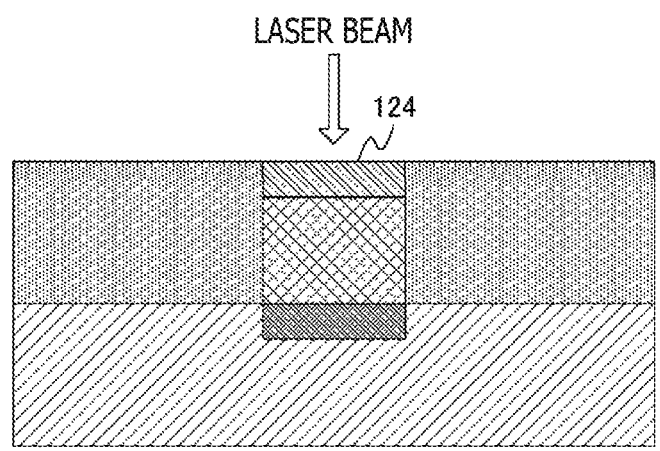

FIGS. 8A and 8B are diagrams depicting a configuration example of an alignment mark according to the third embodiment of the present technique. This drawing is a cross-sectional diagram depicting the configuration example of the film 21 included in the alignment mark 20. In this drawing, FIG. 8A is a diagram depicting the vicinity of the film 21 in the semiconductor device 100 after the epitaxial growth. As depicted in FIG. 8A of this drawing, depending on the conditions for the epitaxial growth, the surface of the film 21 may not be obstructed by the epitaxial layer 120, and a polycrystalline semiconductor layer 123 may be formed up to the surface of the epitaxial layer 120. In this case, the film thickness of the polycrystalline semiconductor layer 123 becomes large, and the visibility of the alignment mark 20 is therefore degraded. The surface of the polycrystalline semiconductor layer 123 is therefore single-crystallized. The single-crystallization can be executed by executing, for example, annealing.

In this drawing, FIG. 8B is a diagram depicting the semiconductor device 100 for which annealing is executed. In addition, an arrow in FIG. 8B of this drawing indicates a laser beam applied to the surface of the polycrystalline semiconductor layer 123. The annealing can be executed by heating the surface of the polycrystalline semiconductor layer 123 by application of a laser beam thereto as described above. The vicinity of the surface of the polycrystalline semiconductor layer 123 is single-crystallized by this annealing, and an epitaxial layer 124 including a single crystalline semiconductor is formed. Degradation of the visibility of the alignment mark 20 can be prevented by single-crystallizing a portion of the epitaxial layer formed on the alignment mark 20 as described above.

The configuration of the semiconductor device 100 except the above is similar to the configuration of the semiconductor device 100 described in the first embodiment of the present technique and will therefore not be described again.

As described above, as to the semiconductor device 100 of the third embodiment of the present technique, the epitaxial layer 120 formed on the alignment mark 20 is single-crystallized by annealing or the like. The epitaxial layer 120 including a single-crystalline semiconductor can thereby be disposed on the alignment mark 20 even in a case where a thick polycrystalline semiconductor layer is formed on the alignment mark 20 when the epitaxial growth takes place. Degradation of the visibility of the alignment mark 20 can be prevented.

4. Fourth Embodiment

As to the semiconductor device 100 of the above-described first embodiment, the surface of the alignment mark 20 is obstructed by the epitaxial layer 120 that is epitaxially grown on the surface of the semiconductor substrate 110. In contrast, the semiconductor device 100 of the fourth embodiment of the present technique differs from the first embodiment in that the surface of the alignment mark 20 is obstructed by the epitaxial layer 120 that is epitaxially grown on a side face of the recess portion 119 formed in the semiconductor substrate 110.

[Configuration of Alignment Mark]

Figure 9A:
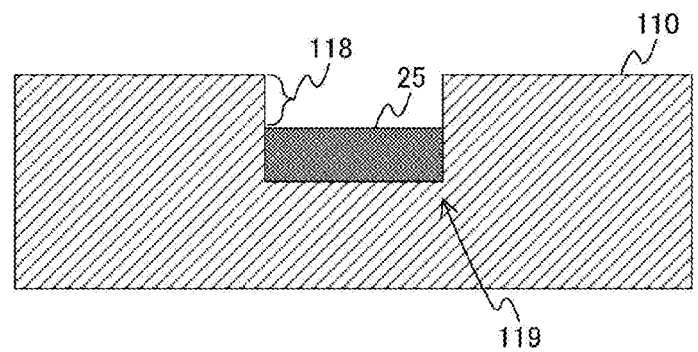
FIGS. 9A, 9B, and 9C are diagrams depicting a configuration example of an alignment mark according to a fourth embodiment of the present technique.
Figure 9B:
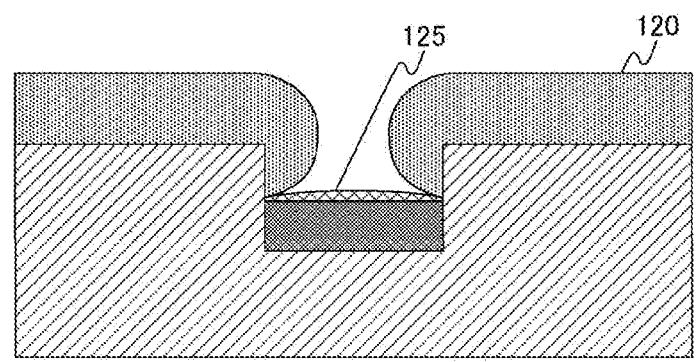
Figure 9C:
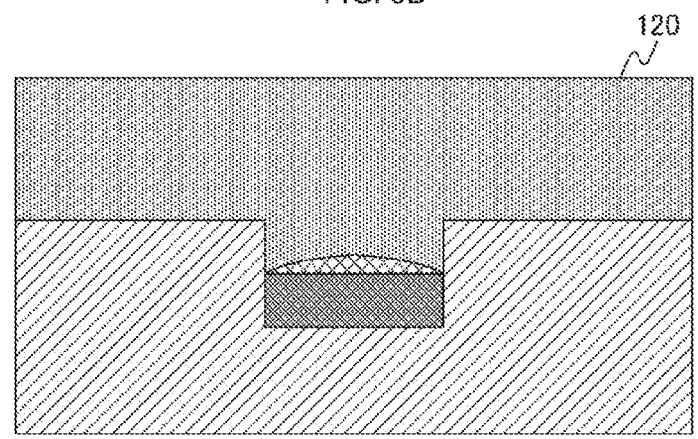

FIGS. 9A, 9B, and 9C are diagrams depicting a configuration example of an alignment mark according to the fourth embodiment of the present technique. This drawing is a cross sectional diagram depicting a configuration example of a film 25 included in the alignment mark 20. The alignment mark 20 in this drawing includes the film 25 that is disposed on a portion of the recess portion 119 formed in the semiconductor substrate 110. In other words, because the film thickness of the film 25 is smaller than the depth of the recess portion 119, an area 118 on the side face of the recess portion 119 that is not adjacent to the film 25 is present. Because the surface of the area 118 is a single-crystalline semiconductor face, the single-crystalline epitaxial layer 120 also grows in the area 118 when the epitaxial growth takes place (FIG. 9B of this drawing). The obstruction of the surface of the film 25 by the epitaxial layer 120 can therefore be facilitated.

Because the epitaxial layer 120 having a large film thickness can be formed in the area 118, easy execution of the obstruction of the surface of the film 25 by the epitaxial layer 120 is enabled even in a case where the film 25 having a large width is used as the alignment mark 20. The setting of the epitaxial growth conditions to obstruct the surface of the alignment mark 20 can thereby be simplified. Moreover, as depicted in FIG. 9B of this drawing, the obstruction of the surface of the film 25 by the thick epitaxial layer 120 is enabled even in a case where the polycrystalline semiconductor layer 125 is formed on the surface of the film 25. In this drawing, FIG. 9C is a diagram depicting the configuration of the alignment mark 20 after the epitaxial layer 120 is formed. Note that, needless to say, the shapes described with reference to FIGS. 6A, 6B, 6C, and 6D are each applicable as the shape of the film 25.

The configuration of the semiconductor device 100 except the above is similar to the configuration of the semiconductor device 100 described in the first embodiment of the present technique and will therefore not be described again.

As described above, as to the semiconductor device 100 of the fourth embodiment of the present technique, the surface of the alignment mark 20 is obstructed by the epitaxial layer 120 that is epitaxially grown on the side face of the recess portion 119 formed in the semiconductor substrate 110. The fabrication of the alignment mark 20 can thereby be simplified.

5. Fifth Embodiment

As to the semiconductor device 100 of the above-described first embodiment, the alignment mark 20 including the rectangle-shaped films 21 is used. In contrast, a semiconductor device 100 of the fifth embodiment of the present technique differs from the first embodiment in that an alignment mark 20 including a film formed along the side face of the recess portion 119 formed in the semiconductor substrate 110 is used.

[Configuration of Alignment Mark]

Figure 10A:
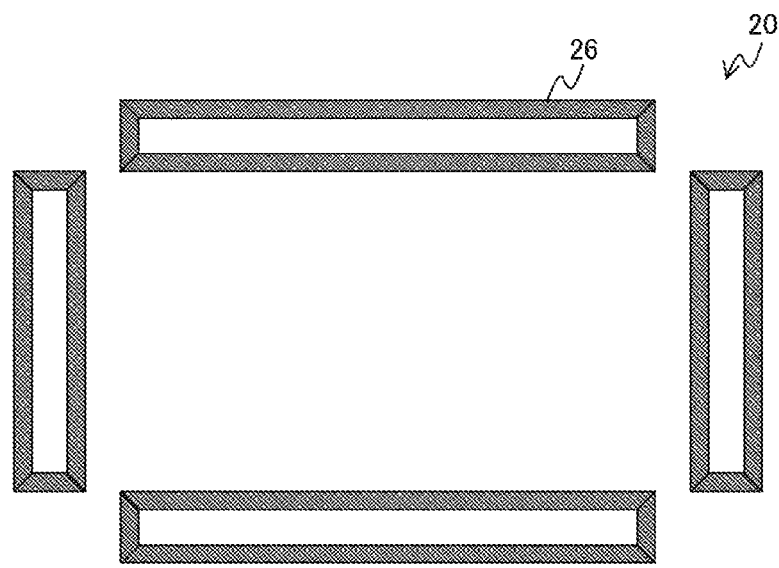
FIGS. 10A and 10B are diagrams depicting a configuration example of an alignment mark according to a fifth embodiment of the present technique.
Figure 10B:
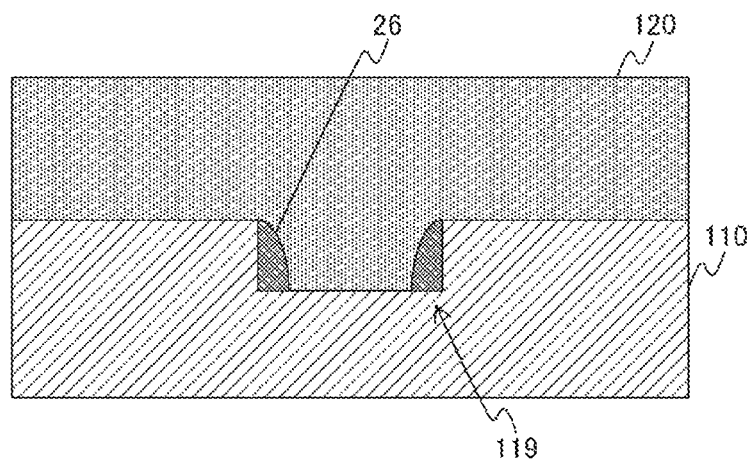

FIGS. 10A and 10B are diagrams depicting a configuration example of an alignment mark according to the fifth embodiment of the present technique. In this drawing, FIG. 10A is a front diagram depicting a configuration example of the alignment mark 20. In this drawing, FIG. 10B is a cross-sectional diagram depicting a configuration example of a film 26 included in the alignment mark 20. The film 26 in this drawing is disposed on the side face and in the vicinity of a corner of the recess portion 119 of the semiconductor substrate 110 and is formed to be annular. In other words, a state in which the semiconductor substrate 110 is exposed in the bottom face except the vicinity of the corner of the recess portion 119 is established. The epitaxial growth therefore also consequently takes place on the bottom face of the recess portion 119. The surface of the alignment mark 20 is consequently obstructed by the epitaxial layer 120 epitaxially grown on the semiconductor substrate 110 on the bottom portion and the periphery of the recess portion 119, and easy execution of the obstruction of the surface of the film 26 is enabled.

The film 26 can be formed as follows. A film of an oxide as the material of the film 26 is formed on the semiconductor substrate 110 having the recess portion 119 formed therein. Etching of the film of the oxide is next executed. This is executed by anisotropic etching. Causing the oxide film to remain on the side face and in the area in the vicinity of the corner of the recess portion 119, the film of the oxide in an area except the above can be removed by this etching. The formation of the film 26 is thereby enabled.

The configuration of the semiconductor device 100 except the above is similar to the configuration of the semiconductor device 100 described in the first embodiment of the present technique and will therefore not be described again.

As described above, as to the semiconductor device 100 of the fifth embodiment of the present technique, the film 21 formed along the side face of the recess portion 119 formed in the semiconductor substrate 110 is used. Because the surface of the alignment mark 20 is obstructed using the epitaxial layer 120 epitaxially grown on the bottom face of the recess portion 119, the fabrication method for the alignment mark 20 can be simplified.

6. Sixth Embodiment

As to the semiconductor device 100 of the above-described first embodiment, the alignment mark 20 including the film of an oxide or the like is used. In contrast, a semiconductor device 100 of the sixth embodiment of the present technique differs from the first embodiment in that an alignment mark 20 including a cavity disposed in the recess portion 119 formed in the semiconductor substrate 110 is used.

[Configuration of Alignment Mark]

Figure 11:
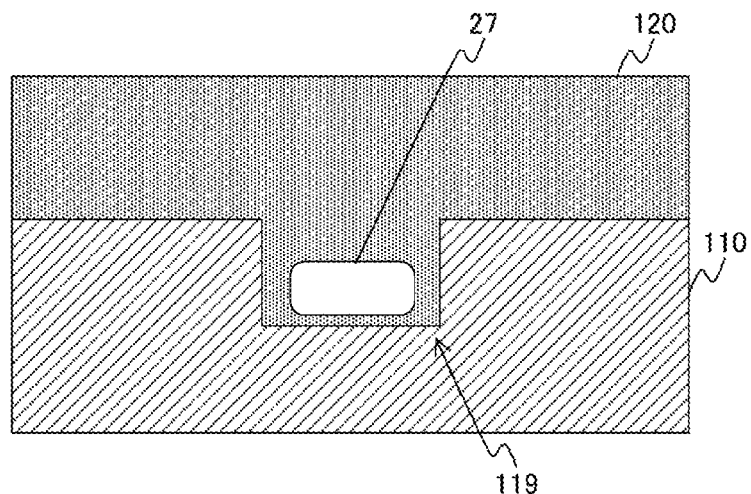
FIG. 11 is a diagram depicting a configuration example of an alignment mark according to a sixth embodiment of the present technique.

FIG. 11 is a diagram depicting a configuration example of an alignment mark according to the sixth embodiment of the present technique. This drawing is a cross-sectional diagram depicting the configuration example of the alignment mark 20. The alignment mark 20 in this drawing includes a cavity 27 formed in the recess portion 119 of the semiconductor substrate 110. This cavity 27 corresponds to the space obstructed by the epitaxial layer 120 grown on the side face of the recess portion 119. This cavity 27 can be regarded as a void that is intentionally formed. The cavity 27 has a refractive index different from that of the epitaxial layer 120 on the periphery thereof, is therefore visually recognizable, and is usable as the alignment mark 20. Similarly to the film 21 described with reference to FIG. 2, the alignment mark 20 can be configured by disposing the cavity 27.

In a case where the depth of the recess portion 119 is large compared to the opening width thereof, the cavity 27 as described above can easily be formed. This is because the opening portion of the recess portion 119 is obstructed before the epitaxial layer is formed in the overall recess portion 119. For example, formation of the alignment mark 20 by the cavity 27 is enabled by forming, in the semiconductor substrate 110, the recess portion 119 whose ratio of its opening width to its depth is a predetermined ratio.

The configuration of the semiconductor device 100 except the above is similar to the configuration of the semiconductor device 100 described in the first embodiment of the present technique and will therefore not be described again.

As described above, as to the semiconductor device 100 of the sixth embodiment of the present technique, the alignment mark 20 including the cavity 27 formed when the epitaxial growth takes place in the recess portion 119 formed in the semiconductor substrate 110 is used. The fabrication method for the alignment mark 20 can thereby be simplified.

7. Seventh Embodiment

The semiconductor device 100 of the above-described first embodiment includes the single epitaxial layer. In contrast, a semiconductor device 100 of the seventh embodiment of the present technique differs from the first embodiment in that an alignment mark is disposed in the semiconductor device 100 that includes plural epitaxial layers.

[Configuration of Alignment Mark]

Figure 12:
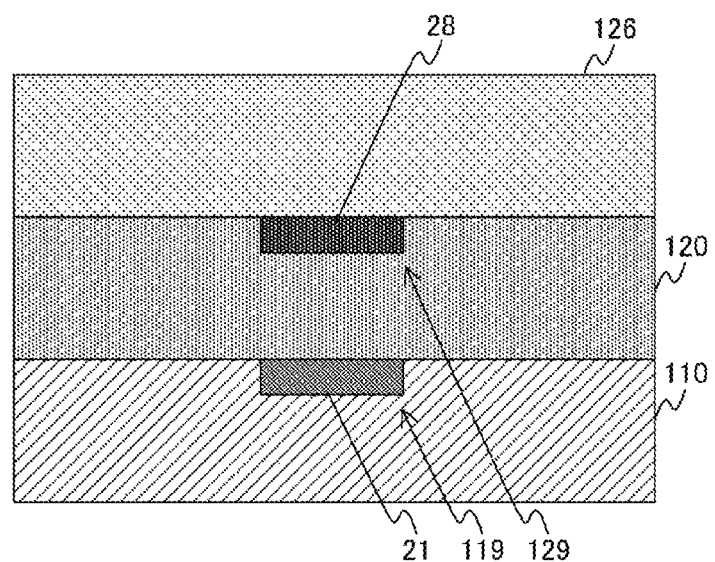
FIG. 12 is a diagram depicting a configuration example of an alignment mark according to a seventh embodiment of the present technique.

FIG. 12 is a diagram depicting a configuration example of the alignment mark according to the seventh embodiment of the present technique. This drawing is a cross-sectional diagram depicting the configuration example of the films 21 and 28 included in the alignment mark 20. The alignment mark 20 in this drawing includes the film 21 disposed in the recess portion 119 in the semiconductor substrate 110 and the film 28 disposed in a recess portion 129 in the epitaxial layer 120. In addition, an epitaxial layer 126 is formed on the upper portions of the epitaxial layer 120 and the film 28. The films 21 and 28 are configured to have substantially the same shape and have a shape that is recognizable (visually recognizable) as one mark in top view.

When the epitaxial layer is formed in the semiconductor device 100, the epitaxial layer may be produced by causing epitaxial growth to take place a plurality of times. For example, in a case where a well region by a thick epitaxial layer is formed, the epitaxial layer is formed by causing the epitaxial growth and subsequent ion implantation to take place alternately. This is executed to facilitate the ion implantation. In this case, formation of the recess portion in and disposition of the film included in the alignment mark 20 on the semiconductor substrate 110 and the like can be executed in each of the formation sessions of the epitaxial layer. Degradation of the visibility of the alignment mark 20 in a case where the film thickness of the epitaxial layer becomes large can thereby be prevented. Moreover, using the alignment mark formed in the previous step (the film 21 included in the alignment mark 20), the succeeding steps (formation of the recess portion 129 and the film 28, and the like) can be executed, and the alignment mark can effectively be utilized.

Note that the configuration of the semiconductor device 100 is not limited to this example. For example, a configuration including three epitaxial layers can also be established. In this case, the alignment mark is disposed between the layers of each of, the semiconductor substrate and the epitaxial layer as a first layer, the epitaxial layers as the first layer and a second layer, and the epitaxial layers as the second layer and a third layer.

The configuration of the semiconductor device 100 except the above is similar to the configuration of the semiconductor device 100 described in the first embodiment of the present technique and will therefore not be described again.

As described above, as to the semiconductor device 100 of the seventh embodiment of the present technique, the plural epitaxial layers are stacked on the semiconductor substrate, and the alignment mark is disposed between the semiconductor substrate and the epitaxial layer, and between the epitaxial layer and the epitaxial layer adjacent thereto. Degradation of the visibility of the alignment mark 20 can thereby be prevented in a case where the plural epitaxial layers are included.

8. Eighth Embodiment

The semiconductor device 100 of the above-described first embodiment has the alignment mark 20 disposed therein by being buried in the recess portion 119 that is formed in the semiconductor substrate 110. In contrast, a semiconductor device 100 of the eighth embodiment of the present technique differs from the first embodiment in that a film included in the alignment mark 20 is disposed in a recess portion that is formed in the epitaxial layer 120.

[Configuration of Alignment Mark]

Figure 13:
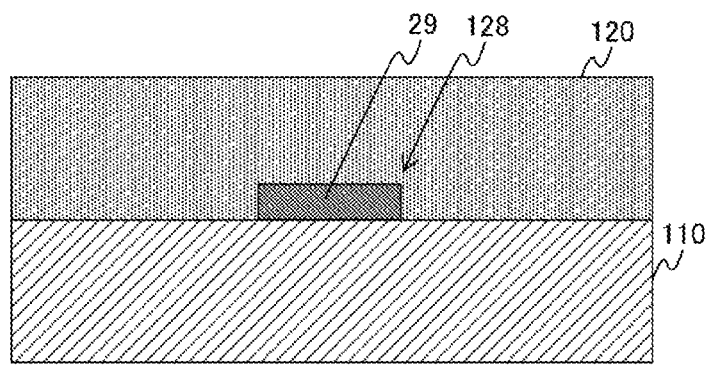
FIG. 13 is a diagram depicting a configuration example of an alignment mark according to an eighth embodiment of the present technique.

FIG. 13 is a diagram depicting a configuration example of an alignment mark according to the eighth embodiment of the present technique. This drawing is a cross-sectional diagram depicting the configuration example of a film 29 included in the alignment mark. The alignment mark 20 in this drawing includes the film 29 disposed in a recess portion 128 of the epitaxial layer 120. More specifically, the film 29 including an oxide or the like is formed on the surface of the semiconductor substrate 110, epitaxial growth is caused to take place thereon, and thereby the epitaxial layer 120 is formed. The configuration for the film 29 to be buried in the recess portion of the epitaxial layer 120 can thereby be established. The surface of the film 29 is obstructed by the epitaxial layer 120 that grows on the semiconductor substrate 110 on the periphery of the film 29. In other words, the epitaxial layer 120 epitaxially grows along the surface of the film 29. For example, the obstruction of the surface of the film 29 by the epitaxial layer 120 can be facilitated by setting the film thickness of the film 29 to be smaller than a predetermined film thickness. Moreover, for example, the obstruction of the surface of the film 29 can similarly be facilitated in a case where the width of the film 29 is formed to be narrower.

The configuration of the semiconductor device 100 except the above is similar to the configuration of the semiconductor device 100 described in the first embodiment of the present technique and will therefore not be described again.

As described above, as to the semiconductor device 100 of the eighth embodiment of the present technique, the alignment mark 20 including the film 29 disposed in the recess portion 128 that is formed in the epitaxial layer 120 is used. The fabrication method for the alignment mark 20 can thereby be simplified.

Finally, the description of the above-described embodiments is an example of the present technique, and the present technique is not limited to the above-described embodiments. Therefore, needless to say, various changes even other than the above-described embodiments can be made according to the design and the like within the scope not departing from the technical idea according to the present technique.

In addition, the present technique can also take the following configurations.

(1)
A semiconductor device including:
a semiconductor substrate;
an epitaxial layer that includes a single-crystalline semiconductor, the single-crystalline semiconductor being epitaxially grown on a surface of the semiconductor substrate; and
an alignment mark that is disposed between the semiconductor substrate and the epitaxial layer.

(2)
The semiconductor device described in (1), in which
the epitaxial layer obstructs a surface of the alignment mark disposed on the semiconductor substrate when the epitaxial growth takes place.

(3)
The semiconductor device described in (2), in which
the alignment mark is disposed in a recess portion that is formed in the semiconductor substrate, and
the epitaxial layer obstructs the surface of the alignment mark by epitaxially growing on a side wall of the recess portion.

(4)
The semiconductor device described in (2), in which
the epitaxial layer obstructs the surface of the alignment mark by single-crystallizing a polycrystalline semiconductor formed on the surface of the alignment mark that is disposed on the semiconductor substrate when the epitaxial growth takes place.

(5)
The semiconductor device described in (4), in which
for the epitaxial layer, the polycrystalline semiconductor formed on the surface of the alignment mark is single-crystallized by an annealing process.

(6)
The semiconductor device described in (2), in which
the alignment mark is disposed along a side wall of a recess portion formed in the semiconductor substrate, and
the epitaxial layer obstructs the surface of the alignment mark by epitaxially growing on a bottom face of the recess portion.

(7)
The semiconductor device described in (2), in which
the epitaxial layer obstructs the surface of the alignment mark by growing along the surface of the alignment mark that is disposed on the semiconductor substrate.

(8)
The semiconductor device described in any one of (1) to (7), in which
the alignment mark includes an oxide film.

(9)
The semiconductor device described in any one of (1) to (7), in which
the alignment mark includes a metal film.

(10)
The semiconductor device described in any one of (1) to (3), in which
the alignment mark includes a cavity.

(11)
A semiconductor device including:
a semiconductor substrate;
plural epitaxial layers that each include a single-crystalline semiconductor, the single-crystalline semiconductor being stacked by a plurality of times of epitaxial growth on the surface of the semiconductor substrate, and
plural alignment marks that are disposed between the semiconductor substrate and the epitaxial layer, and between the epitaxial layers adjacent to each other.

(12)
A fabrication method for a semiconductor device, the fabrication method including:
an alignment mark formation step of forming an alignment mark on a surface of a semiconductor substrate, and
an epitaxial layer formation step of forming an epitaxial layer by epitaxial growth on the surface of the semiconductor substrate and on a surface of the alignment mark.

REFERENCE SIGNS LIST

10 Pixel array part
20 Alignment mark
21, 22, 25, 26, 28, 29 Film
23, 119, 128, 129 Recess portion
100 Cavity
100 Semiconductor device
110 Semiconductor substrate
120, 124, 126 Epitaxial layer
122, 123, 125 Polycrystalline semiconductor layer
130 Wiring region
140 Incident light transmitting part

The invention claimed is:

1. A semiconductor device, comprising:
a semiconductor substrate;
an epitaxial layer that includes a single-crystalline semiconductor, wherein
the single crystalline semiconductor is epitaxially grown on a surface of the semiconductor substrate;
an alignment mark between the semiconductor substrate and the epitaxial layer; and
a polycrystalline semiconductor layer on a surface of the alignment mark up to a surface of the epitaxial layer, wherein the epitaxial layer obstructs the surface of the alignment mark based on single crystallization of the polycrystalline semiconductor layer on the surface of the alignment mark.

2. The semiconductor device according to claim 1, wherein
the semiconductor substrate has a recess portion,
the recess portion includes the alignment mark, and
the epitaxial layer obstructs the surface of the alignment mark based on growth of the epitaxial layer on a side wall of the recess portion.

3. The semiconductor device according to claim 1, wherein the single crystallization of the polycrystalline semiconductor layer on the surface of the alignment mark is based on an annealing process.

4. The semiconductor device according to claim 1, wherein
the semiconductor substrate has a recess portion,
the recess portion includes the alignment mark along a side wall of the recess portion, and
the epitaxial layer obstructs the surface of the alignment mark based on growth of the epitaxial layer on a bottom face of the recess portion.

5. The semiconductor device according to claim 1, wherein the epitaxial layer obstructs the surface of the alignment mark based on growth of the epitaxial layer along the surface of the alignment mark.

6. The semiconductor device according to claim 1, wherein the alignment mark includes an oxide film.

7. The semiconductor device according to claim 1, wherein the alignment mark includes a metal film.

8. The semiconductor device according to claim 1, wherein the alignment mark includes a cavity.

9. A semiconductor device, comprising:
- a semiconductor substrate;
- a first epitaxial layer and a second epitaxial layer, wherein
  - each of the first epitaxial layer and the second epitaxial layer includes a single-crystalline semiconductor, and
  - the single-crystalline semiconductor of the first epitaxial layer stacks on the single-crystalline semiconductor of the second epitaxial layer;
- a first alignment mark and a second alignment mark, wherein
  - the first alignment mark is between the semiconductor substrate and the first epitaxial layer, and
  - the second alignment mark is between the first epitaxial layer and the second epitaxial layer; and
- a polycrystalline semiconductor layer on a surface of each of the first alignment mark and the second alignment mark, wherein the first epitaxial layer obstructs the surface of the first alignment mark and the second epitaxial layer obstructs the surface of the second alignment mark based on single crystallization of the polycrystalline semiconductor layer on the surface of each of the first alignment mark and the second alignment mark.

10. A fabrication method for a semiconductor device, the fabrication method comprising:
- forming an alignment mark on a recess portion of a semiconductor substrate;
- forming an epitaxial layer by epitaxial growth on a surface of the semiconductor substrate, wherein the epitaxial layer includes a single-crystalline semiconductor; and
- forming a polycrystalline semiconductor layer on a surface of the alignment mark up to a surface of the epitaxial layer, wherein the epitaxial layer obstructs the surface of the alignment mark based on single crystallization of the polycrystalline semiconductor layer on the surface of the alignment mark.

* * * * *